United States Patent
Regner et al.

(10) Patent No.: US 9,529,047 B2
(45) Date of Patent: Dec. 27, 2016

(54) INTEGRATED CIRCUIT DEVICE AND METHOD OF PERFORMING SELF-TESTING WITHIN AN INTEGRATED CIRCUIT DEVICE

(71) Applicants: Markus Regner, Graefelfing (DE); Heiko Ahrens, Munich (DE); Vladimir Vorisek, Forstinning (DE)

(72) Inventors: Markus Regner, Graefelfing (DE); Heiko Ahrens, Munich (DE); Vladimir Vorisek, Forstinning (DE)

(73) Assignee: Freescale Semiconductor, Inc., Austin, TX (US)

( * ) Notice: Subject to any disclaimer, the term of this patent is extended or adjusted under 35 U.S.C. 154(b) by 270 days.

(21) Appl. No.: 14/468,917

(22) Filed: Aug. 26, 2014

(65) Prior Publication Data

US 2016/0061890 A1    Mar. 3, 2016

(51) Int. Cl.
G01R 31/3187    (2006.01)
G01R 31/3185    (2006.01)

(52) U.S. Cl.
CPC ....... *G01R 31/3187* (2013.01); *G01R 31/3185* (2013.01); *G01R 31/318558* (2013.01); *G01R 31/318536* (2013.01)

(58) Field of Classification Search
CPC .............................. G01R 31/318558
See application file for complete search history.

(56) References Cited

U.S. PATENT DOCUMENTS

| | | | | |
|---|---|---|---|---|
| 5,991,909 A | * | 11/1999 | Rajski | G01R 31/31813 714/729 |
| 6,686,759 B1 | * | 2/2004 | Swamy | G01R 31/31855 324/750.15 |
| 8,086,925 B2 | | 12/2011 | Gass et al. | |

(Continued)

FOREIGN PATENT DOCUMENTS

WO    2008067133 A2    6/2008

OTHER PUBLICATIONS

Baldelli, L. et al., "Diagnosis of Processor Arrays," Twenty-Fourth International Symposium on Fault-Tolerant Computing, 1994. FTCS-24. Digest of Papers; Jun. 15-17, 1994; pp. 48-54.

(Continued)

*Primary Examiner* — Steve Nguyen

(57) ABSTRACT

IC device comprising a plurality of functional components arranged into self-test cells. The IC device is configurable into a first self-test configuration comprising a first set of self-test partitions. Each self-test partition within the first set comprising at least one self-test cell. Functional components of the self-test cell(s) of each self-test partition within the first set are arranged to be configured into at least one scan-chain for said self-test partition when the IC device is configured into the first self-test configuration. The IC device is configurable into a second self-test configuration comprising a second set of self-test partitions. Each self-test partition within the second set comprising at least one self-test cell. Functional components of the self-test cell(s) of each self-test partition within the second set are arranged (Continued)

to be configured into at least one scan-chain for said self-test partition when the IC device is configured into the second self-test configuration.

16 Claims, 9 Drawing Sheets

(56) References Cited

U.S. PATENT DOCUMENTS

| | | | |
|---|---|---|---|
| 9,097,765 B1* | 8/2015 | Charlebois | G01R 31/3177 |
| 2006/0111873 A1* | 5/2006 | Huang | G01R 31/31854 702/185 |
| 2007/0130489 A1* | 6/2007 | Kiryu | G01B 31/31853 714/733 |
| 2009/0251978 A1 | 10/2009 | Gorman et al. | |
| 2011/0179326 A1 | 7/2011 | Sharma et al. | |
| 2012/0124440 A1 | 5/2012 | Gorti et al. | |
| 2012/0233512 A1* | 9/2012 | Huang | G01R 31/31854 714/729 |
| 2012/0239995 A1* | 9/2012 | Gizdarski | G01R 31/31854 714/729 |
| 2012/0278671 A1* | 11/2012 | Goel | G01R 31/31854 714/726 |
| 2014/0372820 A1* | 12/2014 | Rajski | G01R 31/3177 714/727 |

OTHER PUBLICATIONS

Maestrini, P. et al., "Self Diagnosis of Processor Arrays Using a Comparison Model," IEEE Proceedings of the 14th Symposium on Reliable Distributed Systems 1995; Sep. 13-15, 1995; pp. 218-228.
Qian, J. et al., "Logic BIST Architecture for System-Level Test and Diagnosis," Asian Test Symposium, IEEE 2009; Nov. 23-26, 2009; pp. 21-26.
Collet, J.H. et al., "Chip Self-Organization and Fault Tolerance in Massively Defective Multicore Arrays," IEEE Transactions on Dependable and Secure Computing, vol. 8, issue 2; Mar.-Apr. 2011; pp. 207-217.

* cited by examiner

INTEGRATED CIRCUIT DEVICE AND METHOD OF PERFORMING SELF-TESTING WITHIN AN INTEGRATED CIRCUIT DEVICE

FIELD OF THE INVENTION

This invention relates to an integrated circuit device and a method of performing self-testing within an integrated circuit device.

BACKGROUND OF THE INVENTION

In many integrated circuit (IC) applications, and in particular in safety critical applications, self-testing is an essential component of an IC device, whereby one or more self-tests are executed within at least a part of the IC device. Self-testing within an IC device, for example such as a System on Chip (SoC) device or the like, is typically implemented using one or more forms of built-in self-test (BIST) mechanism(s). A Logic built-in self-test (or LBIST) is one form of BIST mechanism in which hardware is provided within an IC device allowing the IC device to test its own operation, as opposed to reliance on external automated test equipment. Other forms of BIST include, by way of example only, MBIST (a BIST optimized for testing internal memory) and software based BIST.

In order to achieve a finer granularity BIST result over specific areas in an SoC, it is known for the SoC and its self-tests to be separated into discrete areas, or 'partitions'. FIG. 1 illustrates a simplified representation of such LBIST partitions for an integrated circuit device such as an SoC 100. In FIG. 1, the SoC 100 has been arranged into i+1 partitions 110, with each partition 110 relating to a distinct area of the SoC 100. These partitions 110 traverse through (functionally) separate self-tests in order to receive information about the operational integrity of the distinct SoC areas. Each self-test is designed to 'exercise' the relevant SoC area in a particular manner such that the combination of tests provides comprehensive test coverage of the relevant SoC area.

BIST mechanisms are a powerful technique for determining quickly whether an IC device or vast regions (e.g., partitions) of an IC device are functional or not. However, a problem with conventional BIST implementations is that they only provide information about the presence of defects inside individual partitions, and do not provide sufficient granularity to identify more precisely within which functional component of a partition a defect may reside. In order to ensure a high level of availability in today's IC devices it is essential to determine the exact defective functional component or components. Only by knowing that information can a system react (in either HW or SW) in a targeted way to solve the issue or at least get around it so the IC device becomes functional again.

A higher self-test partition granularity results in a major increase in design effort and die area, and thus is typically only tolerated in a very limited number of situations.

SUMMARY OF THE INVENTION

The present invention provides an integrated circuit device and a method of performing self-testing within an integrated circuit device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
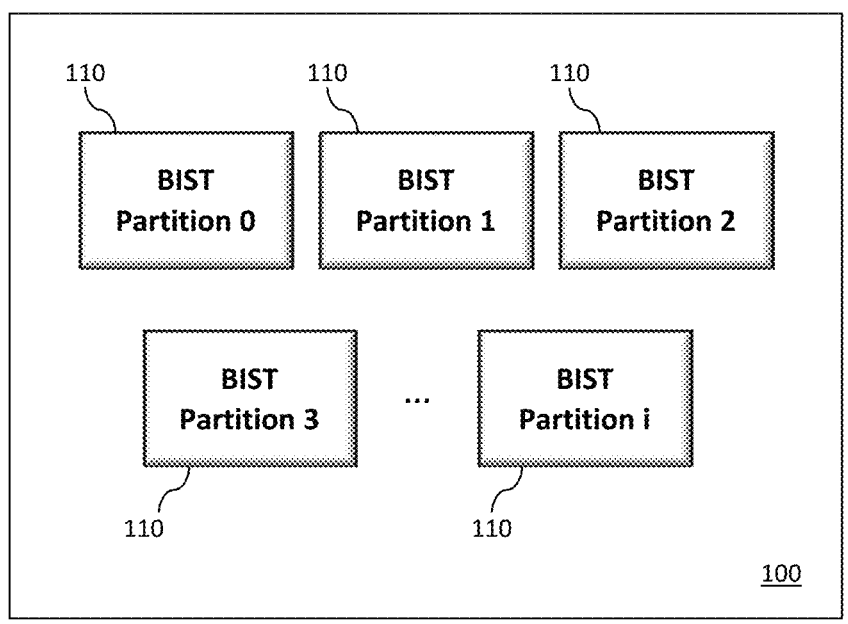
FIG. 1 illustrates a simplified representation of self-test partitions for an integrated circuit device.

The present invention will now be described with reference to the accompanying drawings. However, it will be appreciated that the present invention is not limited to the specific examples herein described and as illustrated in the accompanying drawings, and it will be apparent the various modifications and/or alterations may be made to these specific examples without detracting from the inventive concept.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to some examples of a first aspect of the present invention, there is provided an integrated circuit (IC) device comprising a plurality of functional components arranged into self-test cells. The IC device is configurable into a first self-test configuration comprising a first set of self-test partitions. Each self-test partition within the first set of self-test partitions comprises at least one self-test cell, wherein functional components of the at least one self-test cell of each self-test partition within the first set of self-test partitions are arranged to be configured into at least one scan-chain for the respective self-test partition when the IC device is configured into the first self-test configuration. The IC device is further configurable into at least one further set of self-test configuration comprising at least one further set of self-test partitions. Each self-test partition within the at least one further set of self-test partitions comprises at least one self-test cell, wherein functional components of the at least one self-test cell of each self-test partition within the at least one further set of self-test partitions are arranged to be configured into at least one scan-chain for the respective self-test partition when the IC device is configured into the at least one further self-test configuration.

In this manner, defective/faulty functionality and/or defective/faulty functional blocks (e.g. defective/faulty IP blocks) are able to be detected with a granularity of individual self-test cells, as opposed to the less precise granularity of self-test partitions for conventional self-test implementations. Enabling defective/faulty functionality and/or defective/faulty functional blocks within an IC device to be detected with a finer granularity in this manner (without a major increase in design effort and die area) allows the system to react (either in hardware or software) in a more targeted manner in response to the detection of faults.

In some optional embodiments, it may arranged that no two self-test cells are within a same self-test partition of the first set of self-test partitions and a same self-test partition of the at least one further set of self-test partitions.

In some optional embodiments, it may be arranged that all self-test cells form parts of self-test partitions within at least the first set of self-test partitions.

In some optional embodiments, it may be arranged that all self-test cells form parts of self-test partitions within at least one of the first set of self-test partitions and the at least one further set of self-test partitions.

In some optional embodiments, it may be arranged that no more than one self-test cell within each self-test partition of the first set of self-test partitions does not form a part of a self-test partition of the at least one further set of self-test partitions.

In some optional embodiments, the IC device may comprise a first set of stimulus generator components arranged to execute self-tests within the scan-chains of the first set of self-test partitions and at least one further set of stimulus generator components arranged to execute self-tests within the scan-chains of the at least one further set of self-test partitions.

In some optional embodiments, the IC device may comprise a first set of signature analyzer components arranged to capture signatures output from the scan-chains of the first set of self-test partitions and at least one further set of signature analyzer components arranged to capture signatures output from the scan-chains of the at least one further set of self-test partitions.

In some optional embodiments, each functional component to be tested by way of a built-in test mechanism of the IC device may form part of a self-test cell and each self-test cell may comprise at least one functional component.

In some optional embodiments, the functional components within self-test cells may be arranged to be isolated from functional components within other self-test cells not forming part of a scan-chain therewith during self-test execution.

In some optional embodiments, the IC device may comprise at least one self-test control component arranged to configure the IC device into self-test configurations; wherein the at least one self-test control component may be arranged to output a self-test configuration selection signal to selectively configure functional components within the self-test cells into scan-chains for self-test partitions within the first and at least one further set of self-test partitions.

In some optional embodiments, the at least one self-test control component may be further arranged to control stimulus generator components of the first and at least one further set of self-test partitions to execute self-tests within the scan-chains of the respective self-test partitions.

In some optional embodiments, the at least one self-test control component may be further arranged to receive self-test result indications output by signature analyzer components of the first and at least one further set of self-test partitions.

In some optional embodiments, the at least one self-test control component may be arranged to:
configure the IC device into the first self-test configuration;
cause at least one self-test to be executed within the at least one scan-chain for each self-test partition within the first set of self-test partitions;
receive self-test result indications for signatures output by at least one signature analyzer component for each self-test partition within the first set of self-test partitions in response to the execution of at least one self-test therein;
configure the IC device into the at least one further self-test configuration;
cause at least one self-test to be executed within the at least one scan-chain for each self-test partition within the at least one further set of self-test partitions;
receive self-test result indications for signatures output by at least one signature analyzer component for each self-test partition within the at least one further set of self-test partitions in response to the execution of at least one self-test therein; and
detect a presence of self-test cells comprising at least one defective functional component based on the received self-test result indications for the first and at least one further sets of self-test partitions.

In some optional embodiments, the at least one self-test control component may be arranged to:
configure the IC device into the first self-test configuration;
cause at least one self-test to be executed within the at least one scan-chain for each self-test partition within the first set of self-test partitions;
receive self-test result indications for signatures output by at least one signature analyzer component for each self-test partition within the first set of self-test partitions in response to the execution of at least one self-test therein;
determine whether at least one partition failed the self-test based on the received self-test result indications for signatures output by the at least one signature analyzer component for each self-test partition within the first set of self-test partitions,
wherein the at least one self-test control component is further arranged to, if it is determined that at least one partition failed the self-test:
configure the IC device into the at least one further self-test configuration;
cause at least one self-test to be executed within the at least one scan-chain for each self-test partition within the at least one further set of self-test partitions;
receive self-test result indications for signatures output by at least one signature analyzer component for each self-test partition within the at least one further set of self-test partitions in response to the execution of at least one self-test therein; and detect a presence of self-test cells comprising at least one defective functional component based on the received self-test result indications for the first and at least one further sets of self-test partitions.

According to some examples of a second aspect of the present invention, there is provided a method of performing self-testing within an integrated circuit (IC) device. The method comprises:

configuring the IC device into a first self-test configuration comprising a first set of self-test partitions, each self-test partition within the first set of self-test partitions comprising at least one self-test cell, wherein functional components of the at least one self-test cell of each self-test partition within the first set of self-test partitions are configured into at least one scan-chain for the respective self-test partition;

executing at least one self-test within the at least one scan-chain for each self-test partition within the first set of self-test partitions;

analyzing signatures output by at least one signature analyzer component for each self-test partition within the first set of self-test partitions in response to the execution of at least one self-test therein;

configuring the IC device into at least one further self-test configuration comprising at least one further set of self-test partitions, each self-test partition within the at least one further set of self-test partitions comprising at least one self-test cell, wherein functional components of the at least one self-test cell of each self-test partition within the at least one further set of self-test partitions are configured into at least one scan-chain for the respective self-test partition;

executing at least one self-test within the at least one scan-chain for each self-test partition within the at least one further set of self-test partitions;

analyzing signatures output by at least one signature analyzer component for each self-test partition within the at least one further set of self-test partitions in response to the execution of the at least one self-test therein; and detecting a presence of self-test cells comprising at least one defective functional component based on signature analysis for the first and at least one further sets of self-test partitions.

According to some examples of a third aspect of the present invention, there is provided a method of performing self-testing within an integrated circuit (IC) device. The method comprises:

configuring the IC device into a first self-test configuration comprising a first set of self-test partitions, each self-test partition within the first set of self-test partitions comprising at least one self-test cell, wherein functional components of the at least one self-test cell of each self-test partition within the first set of self-test partitions are configured into at least one scan-chain for the respective self-test partition;

executing at least one self-test within the at least one scan-chain for each self-test partition within the first set of self-test partitions;

analyzing signatures output by at least one signature analyzer component for each self-test partition within the first set of self-test partitions in response to the execution of at least one self-test therein; and determining whether at least one partition failed the self-test based on the signature analysis for the first set of self-test partitions.

Wherein the method further comprises, if it is determined that at least one partition failed the self-test:

configuring the IC device into at least one further self-test configuration comprising at least one further set of self-test partitions, each self-test partition within the at least one further set of self-test partitions comprising at least one self-test cell, wherein functional components of the at least one self-test cell of each self-test partition within the at least one further set of self-test partitions are configured into at least one scan-chain for the respective self-test partition;

executing at least one self-test within the at least one scan-chain for each self-test partition within the at least one further set of self-test partitions;

analyzing signatures output by the at least one signature analyzer component for each self-test partition within the at least one further set of self-test partitions in response to the execution of at least one self-test therein; and identifying each self-test cell comprising at least one defective functional component based on the signature analysis for the first and at least one further sets of self-test partitions.

Figure 2:
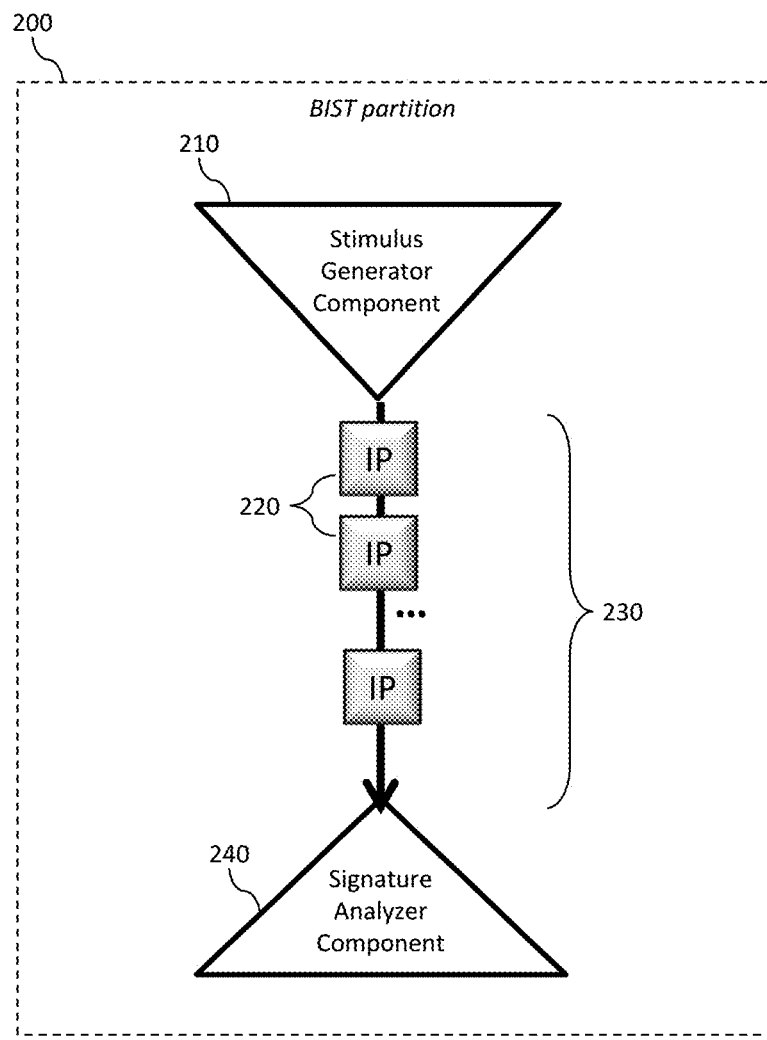
FIG. 2 illustrates a simplified diagram of an example of a self-test partition.

Referring now to FIG. 2, there is illustrated a simplified diagram of an example of a built in self-test (BIST) partition 200 that may be implemented within an integrated circuit (IC) device (not shown in FIG. 2). Such self-test partitions 200 are well known in the art, and as such are only described herein in general terms to aid understanding of the present invention. The BIST partition 200 comprises one or more stimulus generator component(s) 210, one or more functional component(s) 220 of the IC device arranged into one or more scan-chain(s) 230, and one or more signature analyzer(s) 240. The stimulus generator component(s) 210 is/are arranged to execute self-tests within the respective scan-chains 230, for example by apply one or more self-test pattern(s) to the input(s) of the scan-chain(s) 230. The signature analyzer component(s) 240 is/are arranged to capture signature(s) output from the scan-chain(s) 230 in response to the self-test(s) executed by the stimulus generator component(s) 210.

As is well known in the art, scan-chains are configurable structures used in design for testing of IC devices that enable individual flip-flops within an IC device to be set and/or observed. A scan-chain may be formed (configured) by way of a special control signal that causes the individual flip-flops to be connected in series to form the required scan-chain, for example through the use of multiplexer components at the inputs of the flip-flops.

During self-test execution, the stimulus generator component 210 is stimulating (by way of the pseudo-random self-test pattern(s)) all functional components 220 connected to the related scan-chain(s) 230 running through the BIST partition 200. A functional component 220 under stimulation will constitute an outputted (mathematically computable) result signature. The signature analyzer component 240 located at the 'end' of the scan-chain(s) 230 is responsible for identifying, capturing and registering the resulting/final signature on the scan-chain(s) 230. This process of applying stimulus and generating result signatures is denoted as 'self-test execution'.

Figure 3:
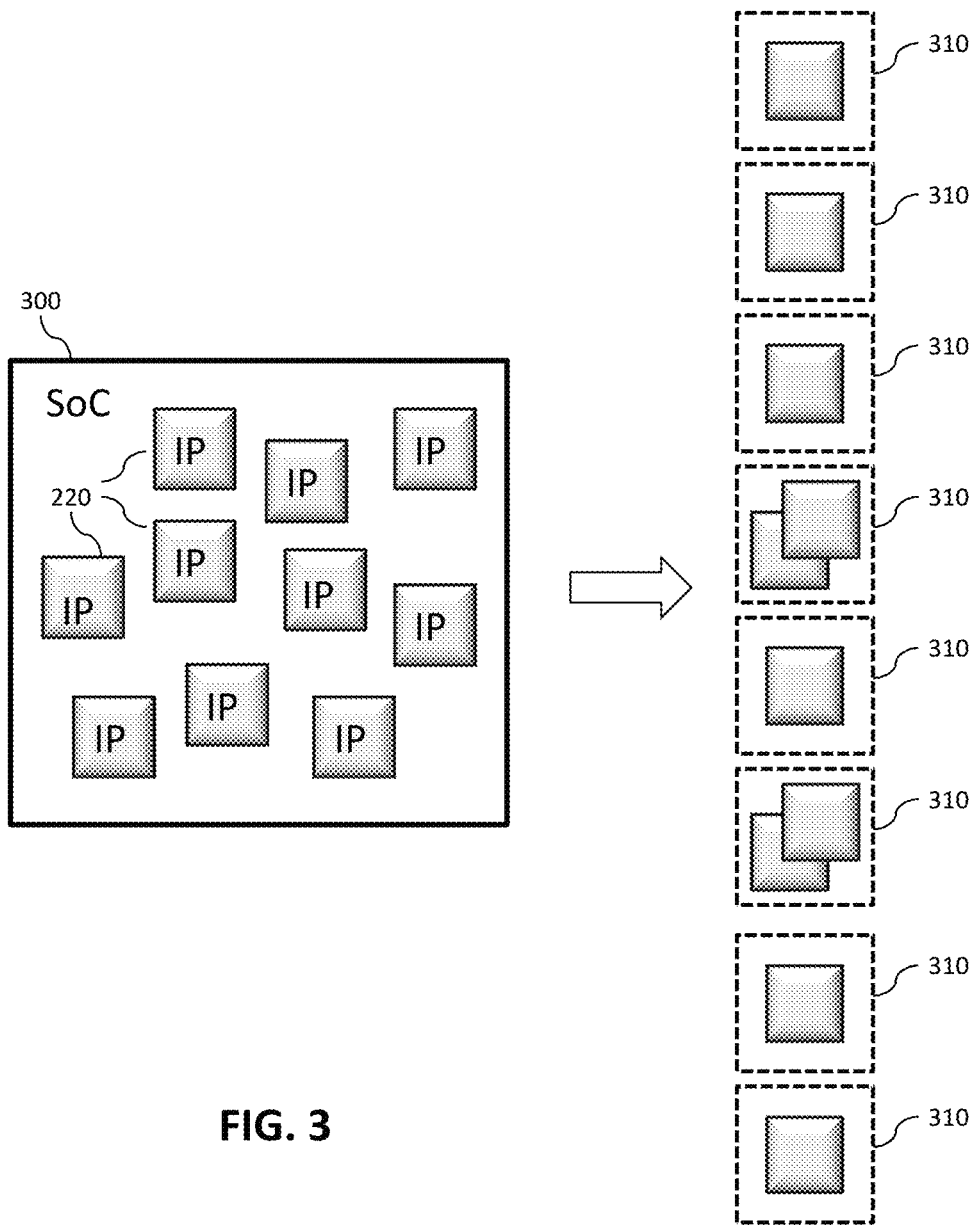
FIG. 3 illustrates a simplified diagram of an example of an IC device.

Referring now to FIG. 3, there is illustrated a simplified diagram of an example of an IC device 300. In the example illustrated in FIG. 3, the IC device 300 comprises a Systemon-Chip (SoC) device. However, the IC device 300 may equally comprise alternatively forms of IC device, such as, by way of example only, a microcontroller unit (MCU), a microprocessor unit (MPU), a digital signal processor (DSP) device, etc.

The IC device 300 comprises various functional components 220. Such functional components 220 may provide substantially any type of functionality present within such an IC device. For example, such functional components 220 may comprise processing functionality (e.g. processing cores), memory access functionality, memory components, system interconnect functionality (e.g. bus functionality and/or crossbar switch functionality), power management functionality, peripheral interface functionality, input/output functionality, motor control sub-system components, etc.

In accordance with examples of the present invention, at least some of the functional components 220 are arranged into self-test cells 310, and in particular each functional component 220 to be tested by way of a built-in self-test mechanism of the IC device 300 forms part of a self-test cell 310 and each self-test cell 310 comprises at least one functional component 220. The distribution of functional components 220 into the self-test cells 310 may be arranged in any suitable manner. For example, the functional components 220 may be distributed into self-test cells 310 based on, say, their functionality, their respective IP (intellectual property) blocks, etc. In particular, the functional components 220 may be distributed into self-test cells 310 such that a desired/required granularity is achieved for identifying defective/faulty functional components 220.

In accordance with some examples of the present invention, the IC device 300 is configurable into a first self-test configuration comprising a first set of self-test partitions. Each self-test partition within the first set of self-test partitions comprises at least one self-test cell, wherein functional components of the self-test cell(s) of each self-test partition within the first set of self-test partitions is/are arranged to be configured into at least one scan-chain for the respective self-test partition when the IC device 300 is configured into the first self-test configuration. The IC device 300 is further configurable into at least one further self-test configuration comprising at least one further set of self-test partitions. Each self-test partition within each further set of self-test partitions comprises at least one self-test cell, wherein functional components of the self-test cell(s) of each self-test partition within each further set of self-test partitions are arranged to be configured into at least one scan-chain for the respective self-test partition when the IC device 300 is configured into the respective further self-test configuration.

Figure 4:
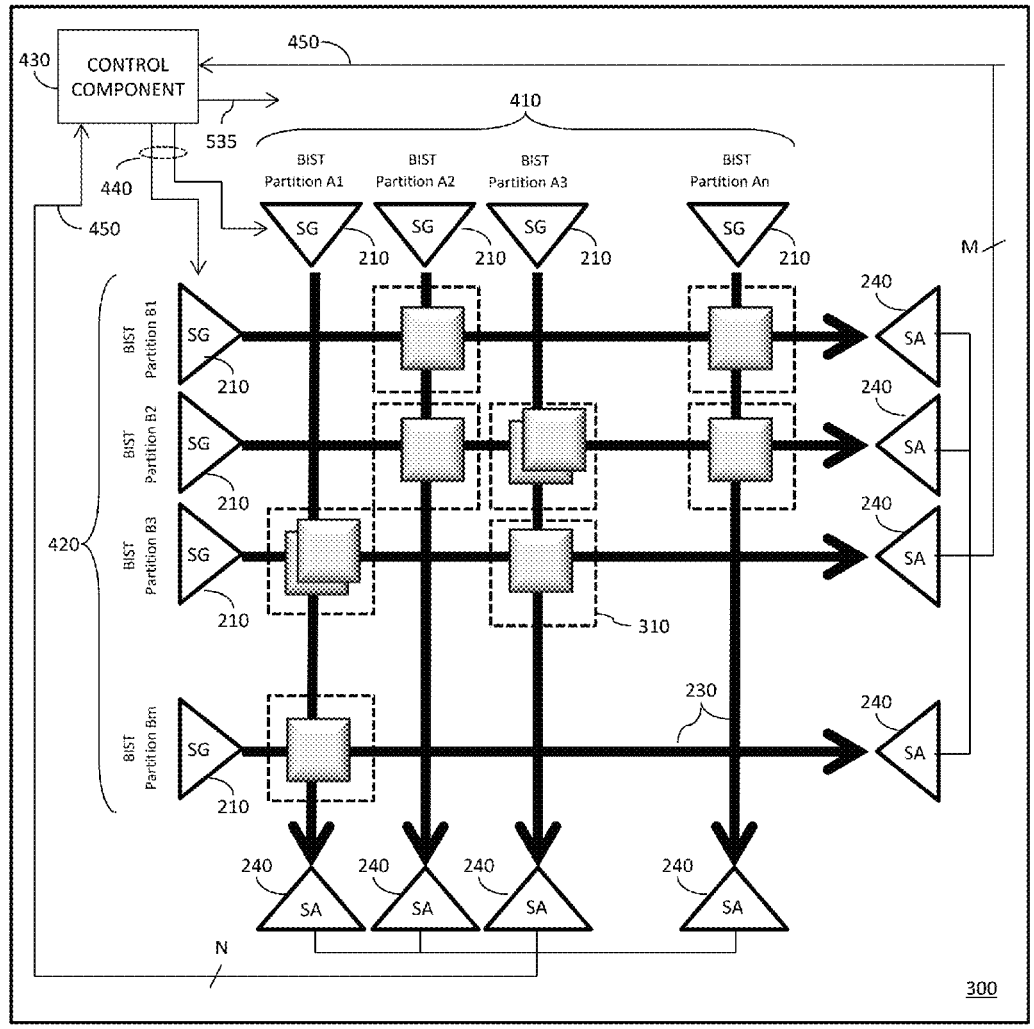
FIG. 4 illustrates a simplified representation of a first self-test configuration for the IC device of FIG. 3 comprising a first set of self-test partitions, and a second self-test configuration for the IC device of FIG. 3 comprising a second set of self-test partitions.

FIG. 4 illustrates a simplified representation of a first self-test configuration for the IC device 300 comprising a first set of self-test partitions, indicated generally at 410, and a second self-test configuration for the IC device 300 comprising a second set of self-test partitions, indicated generally at 420. In the example illustrated in FIG. 4, the self-test cells 310 have been illustrated by way of a self-test matrix structure for ease of understanding, whereby each column represents a self-test partition within the first set of self-test partitions 410 and each row represents a self-test partition within the second set of self-test partitions 420. It will be appreciated that the matrix structure illustrated in FIG. 4 is not intended to be representative of the physical layout of the self-test cells 310 or functional components 220 within the IC device 300. Furthermore, and as illustrated in FIG. 4, not every cell (i.e. every column/row intersection) within the matrix structure need comprise a self-test cell 310 comprising functional components 220 of the IC device 300.

In the example illustrated in FIG. 4, the first set of self-test partitions 410 comprises N self-test partitions, and the second set of self-test partitions 420 comprises M self-test partitions. Thus, for the illustrated example, the self-test cells 310 are arranged into an N×M self-test matrix structure. As illustrated in FIG. 4, it is contemplated that no two self-test cells 310 should be within a same self-test partition of the first set of self-test partitions 410 and a same self-test partition of the second set of further self-test partitions 420. In this manner, and as will become more apparent from the description below, a granularity of a single cell may be achieved for detecting defective functional components.

A first set of stimulus generator components 210 for the first set of self-test partitions 410 are arranged to execute self-tests in the scan-chains 230 of the respective self-test partitions within the first set of self-test partitions 410. A second set of stimulus generator components 210 for the second set of self-test partitions 420 are arranged to execute self-tests in the scan-chains 230 of the respective self-test partitions within the second set of self-test partitions 420. Furthermore, a first set of signature analyzer components 240 are arranged to capture signatures output from the scan-chains 230 of the first set of self-test partitions 410 and a second set of signature analyzer components 240 are arranged to capture signatures output from the scan-chains 230 of the second set of self-test partitions 420.

Figure 5:
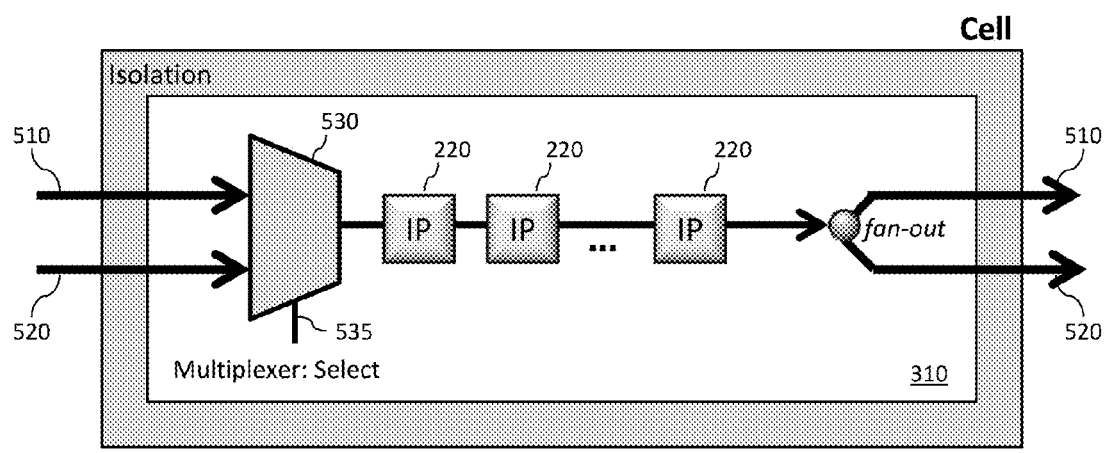
FIG. 5 illustrates a simplified block diagram of an example of a self-test cell.

Referring now to FIG. 5, there is illustrated a simplified block diagram of an example of a self-test cell 310. In the example illustrated in FIG. 5, the self-test cell 310 is arranged to form a part of two self-test partitions; e.g. a self-test partition within the first set of self-test partitions 410 (FIG. 4) and a self-test partition within the second set of self-test partitions 420 (FIG. 4). As such, the functional components 220 within the self-test cell 310 are selectively configurable to be operably coupled within (at least) a first scan-chain 510 for the first of the self-test partitions (e.g. within the first set of self-test partitions 410) and within (at least) a second scan-chain 520 for the second of the self-test partitions (e.g. within the second set of self-test partitions 420). For example, and as illustrated in FIG. 5, the self-test cell 310 may comprise a multiplexer component 530 controllable by way of a self-test configuration selection signal 535 to operably couple an input of a scan-chain section formed by the functional components 220 of the self-test cell 310 to upstream scan-chain sections for either the first scan-chain 510 or the second scan-chain 520.

As will be appreciated, each self-test cell 310 may contain multiple scan-chain sections in which functional components 220 are interconnected when the self-test cell 310 is arranged to form part of a self-test partition. Depending on the cell-internal multiplexer selection these scan-chain sections may be either connected to form a part of (at least) a first scan-chain 510 for the first of the self-test partitions (e.g. within the first set of self-test partitions 410) or within (at least) a second scan-chain 520 for the second of the self-test partitions (e.g. within the second set of self-test partitions 420).

In some examples of the present invention, the functional components 220 within each self-test cell 310 may be arranged to be isolated from functional components within other self-test cells not forming part of a scan-chain therewith during self-test execution. Such isolation helps to minimise interference and inter-cell influence that may otherwise occur during self-test execution, and in particular minimizes or even prevents cell interaction which could otherwise prevent the correct identification of a failing cell. It will be appreciated that such isolation does not apply to the active scan-chain connections entering and leaving the self-test cell 310, nor required signals such as clock signals, reset signals, power supply signals, etc.

In some examples, every self-test cell 310 may form a part of a scan-chain of a self-test partition within at least one set of self-test partitions 410, 420, and at least a majority of the self-test cells 310 may form a part of a scan-chain 230 of a self-test partition within each of the first and second sets of self-test partitions 410, 420.

Referring back to FIG. 4, in the illustrated example the IC device 300 further comprises a self-test control component 430 arranged to configure the IC device 300 into self-test configurations. For example, and as illustrated in FIG. 4, the self-test control component 430 is arranged to output the self-test configuration selection signal 535 to each of the self-test cells 310 (or at least to those cells 310 that are part of more than one self-test partition). In this manner, the self-test control component 430 may be arranged to operably couple the functional components 220 within the self-test cells 310 to form the scan-chains 230 for the self-test partitions within the first set of self-test partitions 410 when the IC device 300 is in the first self-test configuration, and to operably couple the functional components 220 within the self-test cells 310 to form the scan-chains 230 for the self-test partitions within the second set of self-test partitions 420 when the IC device 300 is in the second self-test configuration.

In this manner, the self-test control component 430 may be arranged to control, via control signals 440, the stimulus generator components 210 for the first set of self-test partitions 410 to start self-test execution within the scan-chains of the first set of self-test partitions 410 when the IC device 300 is in the first self-test configuration, and to control, via control signals 440, the stimulus generator components 210 for the second set of self-test partitions 420 to start self-test execution within the scan-chains of the second set of self-test partitions 420 when the IC device 300 is in the second self-test configuration.

The self-test control component 430 is further arranged to receive self-test result indications 450 output by the signature analyzer components 240 for each set of self-test partitions 410, 420. The self-test result indication output by each signature analyzer component 240 provides an indication of whether, for example, the signature output by the respective self-test partition scan-chain matches an expected signature. Each self-test result indication 450 may also comprise an indication of whether the respective self-tests have completed. In some examples, each signature analyzer component 240 may be arranged to compare a captured signature to a corresponding expected signature, and to output a self-test result indication 450 comprising an indication of whether the captured signature matches the corresponding expected signature. In some alternative examples, the signature analyser components 240 may simply output self-test result indications 450 comprising the captured signatures. In such examples, the self-test control component 430 may be arranged to receive the self-test result indications comprising the captured signatures and to compare them to corresponding expected signatures.

Figure 6:
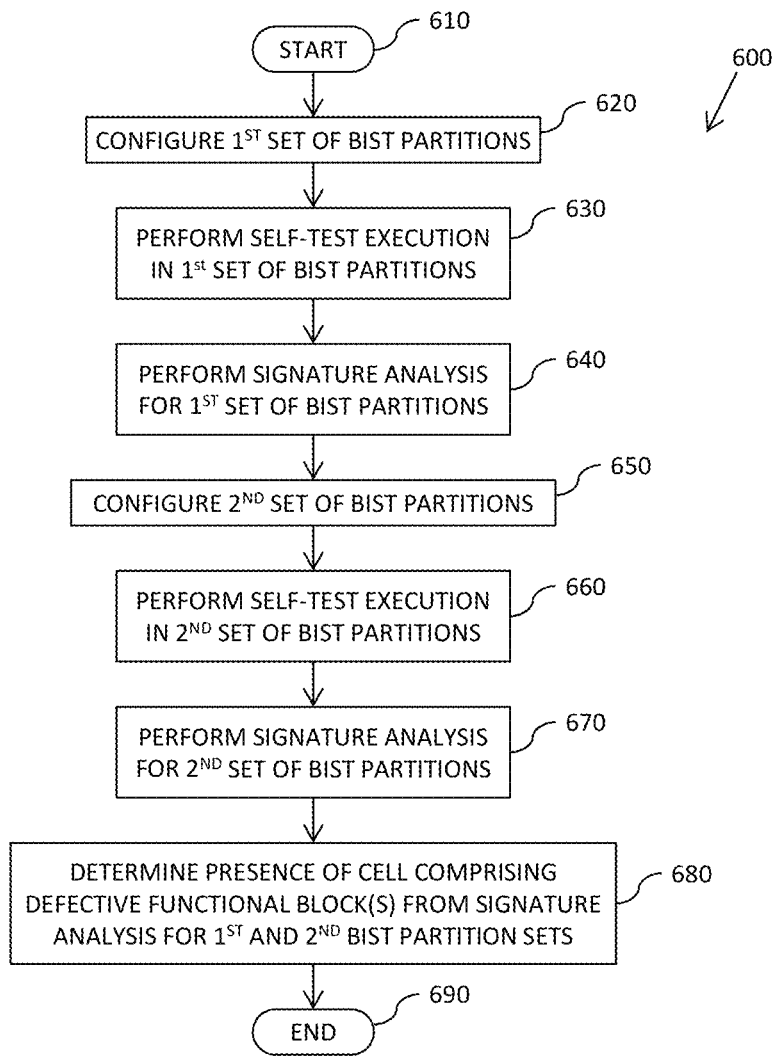
FIG. 6 illustrates a simplified flowchart of an example of a method of performing self-testing within an IC device.

Referring now to FIG. 6, there is illustrated a simplified flowchart 600 of an example of a method of performing self-testing within an IC device, such as may be implemented within the IC device 300 of FIGS. 3 and 4. The method starts at 610, and moves on to 620 where the IC device is configured into a first self-test configuration comprising a first set of self-test partitions. For example, the self-test control component 430 in the example illustrated in FIG. 4 may be arranged to output the self-test configuration selection signal to configure the self-test cells 310 into scan-chains for the first set of self-test partitions 410. Next, at 630, self-test execution is then performed within the scan-chains of the first set of self-test partitions. Each self-test executed within the scan-chains of the first set of self-test partitions results in a signature being output. These signatures are then analyzed, at 640. In the example illustrated in FIG. 4, such signature analysis may be performed by the respective signature analyzers 240, which may then output to the self-test control component 430 indications 450 of whether the resulting signatures match expected signatures.

In the example method illustrated in FIG. 6, the method then moves on to 650 where the IC device is configured into a second self-test configuration comprising a second set of self-test partitions. For example, the self-test control component 430 in the example illustrated in FIG. 4 may be arranged to output the self-test configuration selection signal to configure the self-test cells 310 into scan-chains for the second set of self-test partitions 420. Next, at 660, self-test execution is then performed within the scan-chains of the second set of self-test partitions. Each self-test executed within the scan-chains of the second set of self-test partitions results in a signature being output. These signatures are then analyzed, at 670. In the example illustrated in FIG. 4, such signature analysis may be performed by the respective signature analyzers 240, which may then output to the self-test control component 430 indications 450 of whether the respective signatures match expected signatures.

The presence (or not) of self-test cells comprising defective functional components may then be determined at 690 based on the signature analysis for the first and second sets of self-test partitions, and the method ends at 695.

Figure 7:
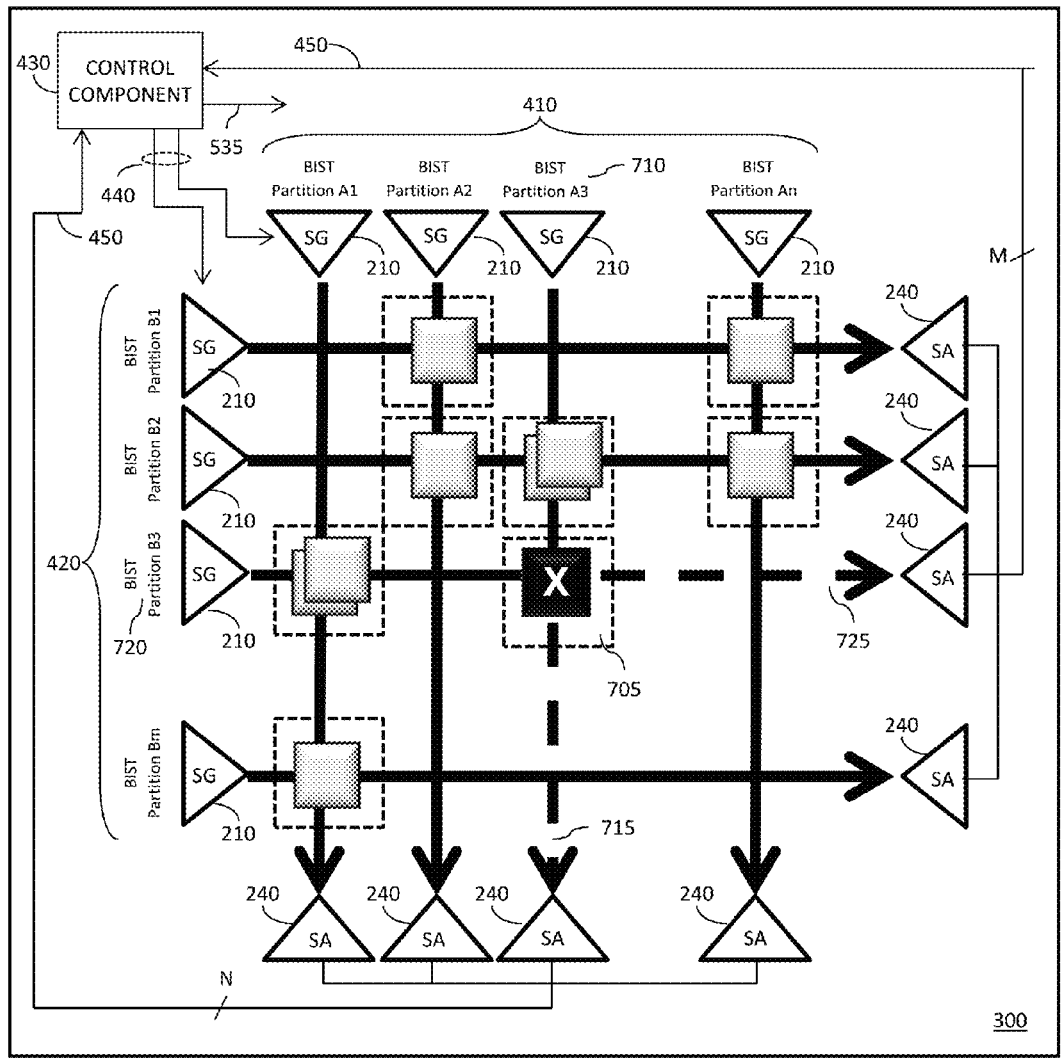
FIG. 7 illustrates an example of an IC device comprising a self-test cell within which there is a defective/faulty functional component.

FIG. 7 illustrates an example of the IC device 300 comprising a self-test cell 705 within which there is a defective/faulty functional component. In the illustrated example, this self-test cell is located within self-test partition A3 710 within the first set of self-test partitions 410 and within self-test partition B3 720 within the second set of self-test partitions 420. Because of the defective/faulty functional component within the self-test cell 705, when a self-test is executed within the scan-chain(s) of the self-test partition A3 710, the resulting signature 715 captured by the signature analyzer 240 of the self-test partition A3 710 will not match an expected signature therefor. As such, the signature analyzer 240 will output an indication 450 that the self-test partition A3 710 failed the self-test. Similarly, when a self-test is executed within the scan-chain of the self-test partition B3 720, the resulting signature 725 captured by the signature analyzer 240 of the self-test partition B3 720 will not match an expected signature therefor. As such, the signature analyzer 240 will output an indication 450 that the self-test partition B3 720 failed the self-test. Upon receipt of the indications that self-test partitions A3 710 and B3 720 failed their respective self-tests, the self-test control component 430 is able to determined that the defective functional components are present within that self-test cell 705, since the self-test cell 705 is the only self-test cell within both of the self-test partitions A3 710 and B3 720, the self-test control component 430.

In this manner, defective/faulty functionality and/or defective/faulty functional blocks is able to be detected with a granularity of individual self-test cells 310, as opposed to the less precise granularity of self-test partitions for conventional self-test implementations. Enabling defective/faulty functionality and/or defective/faulty functional blocks within an IC device to be detected with a finer granularity in this manner (without a major increase in design effort and die area) allows the system to react (either in hardware or software) in a more targeted manner in response to the detection of faults.

In the examples illustrated in FIGS. 4 and 7, each self-test cell 310 forms a part of a self-test partition within both the first set of self-test partitions 410 and the second set of self-test partitions 420. However, the inventors have recognized that some of the self-test cells 310 may only form a part of one self-test partition whilst still enabling defective/faulty functionality and/or defective/faulty functional blocks to be detected with a granularity of individual self-test cells 310. For example, if no more than one self-test cell 310 within each self-test partition of, say, the first set of self-test partitions 410 is not also within a self-test partition of the second set of self-test partitions 420, then it is possible to detect defective/faulty functionality and/or defective/faulty functional blocks with a granularity of individual self-test cells 310.

Figure 8:
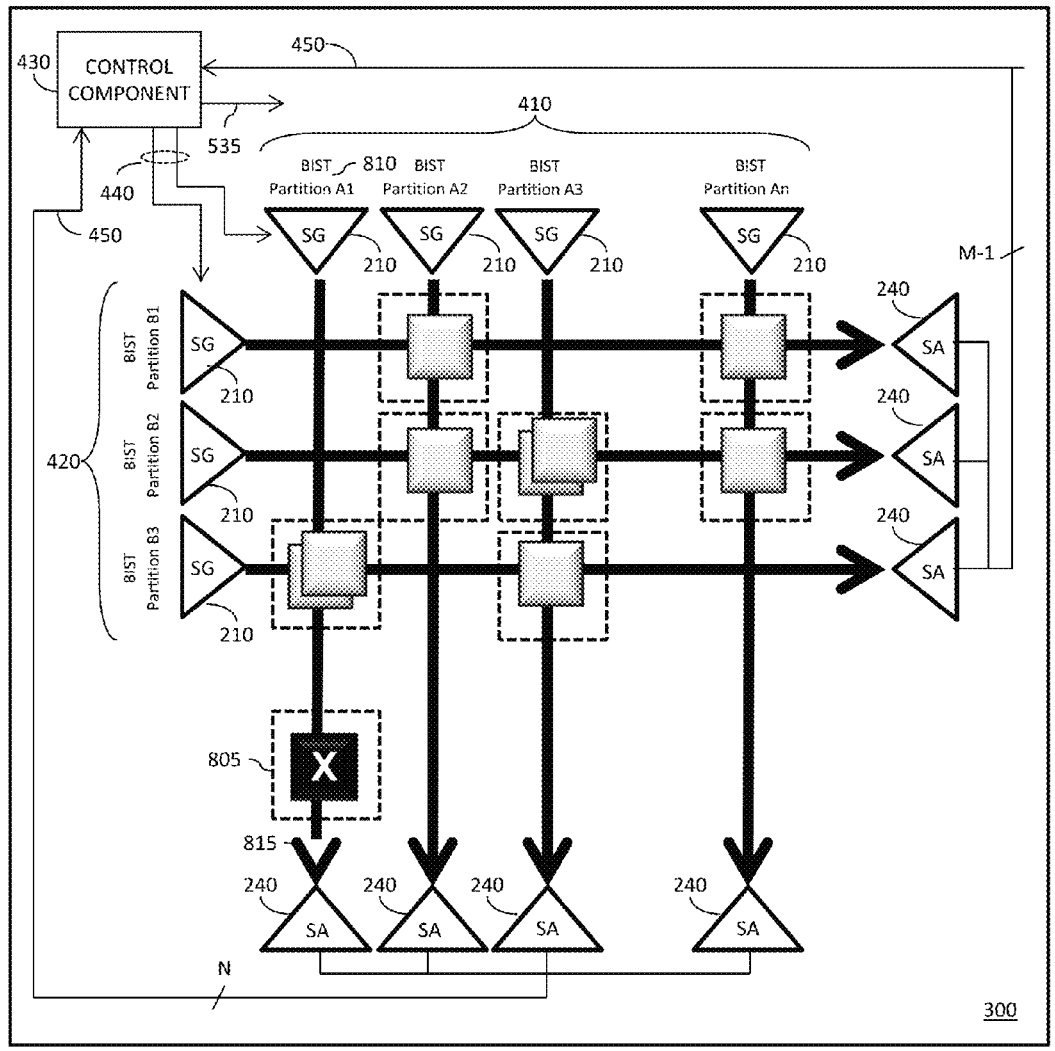
FIG. 8 illustrates an alternative example of an IC device comprising a self-test cell that only forms part of a self-test partition within a first set of self-test partitions, and within which there is a defective/faulty functional component.

FIG. 8 illustrates an alternative example of the IC device 300 comprising a self-test cell 805 that only forms part of a self-test partition within the first set of self-test partitions 410, and within which there is a defective/faulty functional component. In this illustrated example, this self-test cell is located within self-test partition A1 810 within the first set of self-test partitions 410. Because of the defective/faulty functional component within the self-test cell 805, when a self-test is executed within the scan-chain of the self-test partition A1 810, the resulting signature 815 captured by the signature analyzer 240 of the self-test partition A1 810 will not match an expected signature therefor. As such, the signature analyzer 240 will output an indication 450 that the self-test partition A1 810 failed the self-test. Since the self-test cell 805 is not part of a self-test partition within the second set of self-test partitions 420, when self-test are executed within the scan-chains of the second set of self-test partitions 420, no indication of a failed self-test will be output by any of the signature analyzers for the second set of self-test partitions 420. However, because the self-test cell 805 is the only self-test cell within the self-test partition A1 810 that is not a part of a self-test partition within the second set of self-test partitions 420, the self-test control component 430 is able to determine that the defective functional components are present within that self-test cell 805.

In this manner, defective/faulty functionality and/or defective/faulty functional blocks is able to be detected with a granularity of individual self-test cells 310, as opposed to the less precise granularity of self-test partitions for conventional self-test implementations, even though the defective/faulty self-test cell 805 forms a part of only one self-test partition.

In the example method illustrated in FIG. 6, multiple (e.g. two) self-test runs are required to identify within which self-test cell 310 the defective/faulty functional components are located. However, in the example illustrated in FIGS. 4 and 7, all of the self-test cells form parts of self-test partitions within the first set of self-test partitions 410. As such, if every self-test run in the first self-test configuration results in no self-test partitions failing their respective self-tests then there is no need for a subsequent self-test run to be performed for the second set of self-test partitions. Only if a self-test run in the first self-test configuration results in a self-test partition failing need a second self-test run be performed in the second self-test configuration to identify within which self-test cell 310 the defective/faulty functional component is located.

Figure 9:
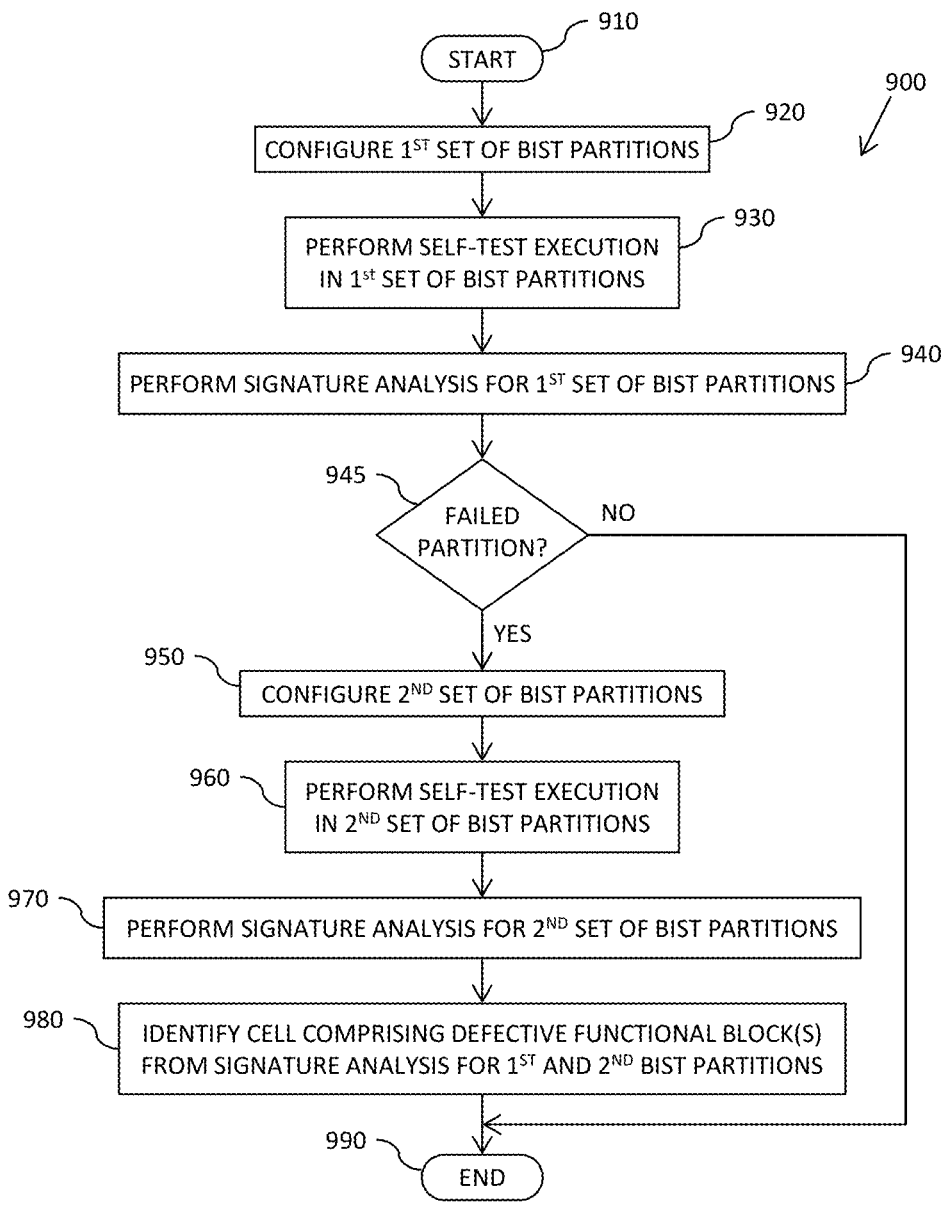
FIG. 9 illustrates a simplified flowchart of an alternative example of a method of performing self-testing within an IC device.

Referring now to FIG. 9, there is illustrated a simplified flowchart 900 of an example of an alternative method of performing self-testing within an IC device, such as may be implemented within the IC device 300 of FIGS. 3 and 4. In the example illustrated in FIG. 9, it is assumed that all self-test cells form parts of self-test partitions within at least a first set of self-test partitions.

The method starts at 910, and moves on to 920 where the IC device is configured into a first self-test configuration comprising a first set of self-test partitions. For example, the self-test control component 430 in the example illustrated in FIG. 4 may be arranged to output the self-test configuration selection signal to configure the self-test cells 310 into scan-chains for the first set of self-test partitions 410. Next, at 930, self-test execution is then performed within the scan-chains of the first set of self-test partitions. Each self-test executed within the scan-chains of the first set of self-test partitions results in a signature being output. These signatures are then analyzed, at 940. In the example illustrated in FIG. 4, such signature analysis may be performed by the respective signature analyzers 240, which may then output to the self-test control component 430 indications 450 of whether the resulting signatures match expected signatures.

In the example method illustrated in FIG. 9, it is then determined from the signature analysis for the first set of self-test partitions whether one or more of the self-test partitions have failed their self-tests (i.e. whether one or more of the self-test partitions within the first set of self-test partitions comprises a self-test cell comprising defective/faulty functional components), at 945. If it is determined that none of the self-test partitions within the first set of self-test partitions has failed their self-tests, since all self-test cells form parts of self-test partitions within at least a first set of self-test partitions then it may be assumed that all functional components within the self-test cells are functioning correctly, and the method ends at 990. In this manner, if a self-test run in the first self-test configuration results in no self-test partitions failing their respective self-tests then there is no need for a subsequent self-test run to be performed for the second set of self-test partitions, thereby minimising the amount of time required for self-test execution and thus the amount of time the functional components under self-test are unavailable.

However, if it is determined that at least one of the self-test partitions within the first set of self-test partitions has failed their self-tests at 945, the method moves on to 950 where the IC device is configured into a second self-test configuration comprising a second set of self-test partitions. For example, the self-test control component 430 in the example illustrated in FIG. 4 may be arranged to output the self-test configuration selection signal to configure the self-test cells 310 into scan-chains for the second set of self-test partitions 420. Next, at 960, self-test execution is then performed within the scan-chains of the second set of self-test partitions. Each self-test executed within the scan-chains of the second set of self-test partitions results in a signature being output. These signatures are then analyzed, at 970. In the example illustrated in FIG. 4, such signature analysis may be performed by the respective signature analyzers 240, which may then output to the self-test control component 430 indications 450 of whether the resulting captured signatures match expected signatures.

The presence (or not) of self-test cells comprising defective functional components may then be determined at 980 based on the signature analysis for the first and second sets of self-test partitions, and the method ends at 990.

In the various examples illustrated in the accompanying drawings, for ease of understanding each self-test partition has been illustrated and described as comprising an exclusive stimulus generator component 210 and an exclusive signature analyzer component 240. However, it will be appreciated that in practice one or more stimulus generator components 210 may be shared across multiple self-test partitions and equally one or more signature analyzer components 240 may be shared across multiple self-test partitions.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic components are merely illustrative and that alternative embodiments may merge logic components or circuit elements or impose an alternate decomposition of functionality upon various logic components or circuit elements. Thus, it is to be understood that the architectures depicted herein are merely exemplary, and that in fact many other architectures can be implemented which achieve the same functionality. For example, a discrete self-test control component and individual stimulus generator components and signature analyzer components have been illustrated and described in relation to each self-test partition for ease of understanding. However, it will be appreciated that such functionality may be implemented within one or more combined functional blocks.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, self-test cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An IC device comprising:
   a plurality of functional components arranged into a set of self-test cells;

the IC device being configurable into a first self-test configuration comprising a first set of self-test partitions, the first set of self-test partitions comprising the set of self-test cells;

each self-test partition within the first set of self-test partitions comprising at least one self-test cell, wherein functional components of the at least one self-test cell of each self-test partition within the first set of self-test partitions are arranged to be configured into at least one scan-chain for the respective self-test partition when the IC device is configured into the first self-test configuration;

the IC device being configurable into at least one further self-test configuration comprising at least one further set of self-test partitions, the at least one further set of self-test partitions comprising the set of self-test cells;

each self-test partition within the at least one further set of self-test partitions comprising at least one self-test cell, wherein functional components of the at least one self-test cell of each self-test partition within the at least one further set of self-test partitions are arranged to be configured into at least one scan-chain for the respective self-test partition when the IC device is configured into the at least one further self-test configuration, wherein no two self-test cells of the set of self-test cells are within a same self-test partition of the first set of self-test partitions and a same self-test partition of the at least one further set of self-test partitions.

2. The IC device of claim 1, wherein all self-test cells form parts of self-test partitions within at least the first set of self-test partitions.

3. The IC device of claim 1, wherein all self-test cells form parts of self-test partitions within at least one of the first set of self-test partitions and the at least one further set of self-test partitions.

4. The IC device of claim 1, wherein no more than one self-test cell within each self-test partition of the first set of self-test partitions does not form a part of a self-test partition of the at least one further set of self-test partitions.

5. The IC device of claim 1, wherein the IC device comprises a first set of stimulus generator components arranged to execute self-tests within the scan-chains of the first set of self-test partitions and at least one further set of stimulus generator components arranged to execute self-tests within the scan-chains of the at least one further set of self-test partitions.

6. The IC device of claim 1, wherein the IC device comprises a first set of signature analyzer components arranged to capture signatures output from the scan-chains of the first set of self-test partitions and at least one further set of signature analyzer components arranged to capture signatures output from the scan-chains of the at least one further set of self-test partitions.

7. The IC device of claim 1, wherein each functional component to be tested by way of a built-in test mechanism of the IC device forms part of a self-test cell and each self-test cell comprises at least one functional component.

8. The IC device of claim 1, wherein the functional components within self-test cells are arranged to be isolated from functional components within other self-test cells not forming part of a scan-chain therewith during self-test execution.

9. The IC device of claim 1, wherein the IC device comprises at least one self-test control component arranged to configure the IC device into self-test configurations; wherein the at least one self-test control component is arranged to output a self-test configuration selection signal to selectively configure functional components within the self-test cells into scan-chains for self-test partitions within the first and at least one further set of self-test partitions.

10. The IC device of claim 9, wherein the at least one self-test control component is further arranged to control stimulus generator components of the first and at least one further set of self-test partitions to execute self-tests within the scan-chains of the respective self-test partitions.

11. The IC device of claim 10, wherein the at least one self-test control component is further arranged to receive self-test result indications output by signature analyzer components of the first and at least one further set of self-test partitions.

12. The IC device of claim 9, wherein the at least one self-test control component is further arranged to receive self-test result indications output by signature analyzer components of the first and at least one further set of self-test partitions.

13. The IC device of claim 9, wherein the at least one self-test control component is arranged to:
configure the IC device into the first self-test configuration;
cause at least one self-test to be executed within the at least one scan-chain for each self-test partition within the first set of self-test partitions;
receive self-test result indications for signatures output by at least one signature analyzer component for each self-test partition within the first set of self-test partitions in response to the execution of at least one self-test therein;
determine whether at least one partition failed the self-test based on the received self-test result indications for signatures output by the at least one signature analyzer component for each self-test partition within the first set of self-test partitions,
wherein the at least one self-test control component is further arranged to, if it is determined that at least one partition failed the self-test:
configure the IC device into the at least one further self-test configuration;
cause at least one self-test to be executed within the at least one scan-chain for each self-test partition within the at least one further set of self-test partitions;
receive self-test result indications for signatures output by at least one signature analyzer component for each self-test partition within the at least one further set of self-test partitions in response to the execution of at least one self-test therein; and
detect a presence of self-test cells comprising at least one defective functional component based on the received self-test result indications for the first and at least one further sets of self-test partitions.

14. The IC device of claim 1, wherein all self-test cells form parts of self-test partitions within at least the first set of self-test partitions.

15. The IC device of claim 1, wherein all self-test cells form parts of self-test partitions within at least one of the first set of self-test partitions and the at least one further set of self-test partitions.

16. A method for self-testing a plurality of functional components within an IC device, the plurality of functional components arranged into a set of self-test cells and the method comprising:
configuring the IC device into a first self-test configuration comprising a first set of self-test partitions, the first set of self-test partitions comprising the set of self-test cells and each self-test partition within the first set of self-test partitions comprising at least one self-test cell, wherein functional components of the at least one self-test cell of each self-test partition within the first set of self-test partitions are configured into at least one scan-chain for the respective self-test partition;

executing at least one self-test within the at least one scan-chain for each self-test partition within the first set of self-test partitions;

analyzing signatures output by the at least one signature analyzer component for each self-test partition within the first set of self-test partitions in response to the execution of at least one self-test therein; and determining whether at least one partition failed the self-test based on the signature analysis for the first set of self-test partitions, wherein the method further comprises, if it is determined that at least one partition failed the self-test:

configuring the IC device into at least one further self-test configuration comprising at least one further set of self-test partitions, the at least one further set of self-test partitions comprising the set of self-test cells and each self-test partition within the at least one further set of self-test partitions comprising at least one self-test cell, wherein functional components of the at least one self-test cell of each self-test partition within the at least one further set of self-test partitions are configured into at least one scan-chain for the respective self-test partition and wherein no two self-test cells of the set of self-test cells are within a same self-test partition of the first set of self-test partitions and a same self-test partition of the at least one further set of self-test partitions;

executing at least one self-test within the at least one scan-chain for each self-test partition within the at least one further set of self-test partitions;

analyzing signatures output by the at least one signature analyzer component for each self-test partition within the at least one further set of self-test partitions in response to the execution of at least one self-test therein; and identifying each self-test cell comprising at least one defective functional component based on the signature analysis for the first and at least one further sets of self-test partitions.

\* \* \* \* \*